United States Patent
Coleman et al.

(10) Patent No.: US 11,304,132 B2
(45) Date of Patent: *Apr. 12, 2022

(54) METHODS AND APPARATUSES FOR DETERMINING CABLE RESISTANCE

(71) Applicant: CommScope Technologies LLC, Hickory, NC (US)

(72) Inventors: Daryl A. Coleman, Winchester, VA (US); Khalid W. Al-Mufti, Sterling, VA (US); Thomas Booker Gravely, Herndon, VA (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/156,247

(22) Filed: Jan. 22, 2021

(65) Prior Publication Data

US 2021/0144635 A1 May 13, 2021

Related U.S. Application Data

(63) Continuation of application No. 16/559,151, filed on Sep. 3, 2019, now Pat. No. 10,912,025, which is a continuation of application No. 15/908,147, filed on Feb. 28, 2018, now Pat. No. 10,499,330.

(60) Provisional application No. 62/472,085, filed on Mar. 16, 2017.

(51) Int. Cl.
| | |
|---|---|
| *H04W 52/02* | (2009.01) |
| *H02H 9/04* | (2006.01) |
| *G05F 1/62* | (2006.01) |

(52) U.S. Cl.
CPC .......... *H04W 52/0206* (2013.01); *G05F 1/62* (2013.01); *H02H 9/04* (2013.01); *Y02D 30/70* (2020.08)

(58) Field of Classification Search
CPC .. H04W 52/0206; H04W 88/085; H02H 9/04; G05F 1/62; Y02D 30/70; G01R 27/16; H04B 1/40; H04B 1/1607
USPC .......................................................... 455/572
See application file for complete search history.

(56) References Cited

U.S. PATENT DOCUMENTS

| | | | |
|---|---|---|---|
| 6,125,048 A | 9/2000 | Loughran et al. | |
| 9,099,860 B2 | 8/2015 | Martinez et al. | |
| 9,448,576 B2 | 9/2016 | Chamberlain et al. | |
| 10,499,330 B2 | 12/2019 | Coleman et al. | |
| 2006/0164108 A1 | 7/2006 | Herbold | |
| 2012/0069882 A1 | 3/2012 | Nino et al. | |

(Continued)

FOREIGN PATENT DOCUMENTS

WO 2015123036 A1 8/2015

OTHER PUBLICATIONS

European Patent Office, "Extended European Search Report from EP Application No. 17900918.8", from Foreign Counterpart to U.S. Appl. No. 15/908,147, dated Nov. 18, 2020, pp. 1 through 9, Published: EP.

(Continued)

*Primary Examiner* — Eugene Yun
(74) *Attorney, Agent, or Firm* — Fogg & Powers LLC (57) ABSTRACT

In one embodiment, a method is provided. The method comprises: setting a first voltage level provided to a cable; operating a radio, coupled to the cable, with constant power consumption; measuring a first current level provided to the cable; setting a second voltage level provided to the cable; measuring a second current level provided to the cable; and determining a first resistance of the cable using the first and second voltage and current levels.

18 Claims, 6 Drawing Sheets

(56) References Cited

U.S. PATENT DOCUMENTS

| | | |
|---|---|---|
| 2013/0051440 A1 | 2/2013 | Rofougaran |
| 2013/0127481 A1 | 5/2013 | Vladan |
| 2015/0234399 A1 | 8/2015 | Chamberlain et al. |
| 2017/0230906 A1 | 8/2017 | Chamberlain et al. |
| 2018/0164355 A1 | 6/2018 | Winkler et al. |
| 2018/0176861 A1 | 6/2018 | Chamberlain et al. |
| 2018/0213091 A1 | 7/2018 | Kostakis et al. |
| 2019/0394723 A1 | 12/2019 | Coleman et al. |

OTHER PUBLICATIONS

International Bureau, "International Preliminary Report on Patentability from PCT Application No. PCT/US2017/066603 dated Sep. 26, 2019", from Foreign Counterpart to U.S. Appl. No. 15/908,147, pp. 1-14, Published: WO.

International Searching Authority, "International Search Report and Written Opinion from PCT Application No. PCT/US2017/066603 dated Mar. 30, 2018", from Foreign Counterpart to U.S. Appl. No. 15/908,147, pp. 1-20, Published: WO.

International Telecommunication Union, "Draft revised Recommendation ITU-T L.60 (latest draft)", Telecommunication Standardization Sector, Study Group 15 TD 326 (WP 2/15), Sep. 2016, pp. 1 through 22, International Telecommunication Sector.

U.S. Patent and Trademark Office, "Notice of Allowance", U.S. Appl. No. 15/908,147, dated Jul. 31, 2019, pp. 1-5, Published: US.

U.S. Patent and Trademark Office, "Notice of Allowance", U.S. Appl. No. 16/559,151, dated Sep. 30, 2020, pp. 1 through 5, Published: US.

U.S. Patent and Trademark Office, "Office Action", U.S. Appl. No. 15/908,147, dated Feb. 4, 2019, pp. 1-12, Published: US.

U.S. Patent and Trademark Office, "Office Action", U.S. Appl. No. 16/559,151, dated Jul. 17, 2020, pp. 1 through 7, Published: US.

U.S. Patent and Trademark Office, "Restriction Requirement", U.S. Appl. No. 15/908,147, dated Jan. 10, 2019, pp. 1-14, Published: US.

U.S. Patent and Trademark Office, "Restriction Requirement", U.S. Appl. No. 16/559,151, dated Jun. 22, 2020, pp. 1 through 15, Published: US.

Australian Government IP Australia, "Examination report No. 1 for standard patent application from AU Application No. 2017404537", from Foreign Counterpart to U.S. Appl. No. 15/908,147, filed Jan. 14, 22, pp. 1 through 4, Published: AU.

FIG. 4C

METHODS AND APPARATUSES FOR DETERMINING CABLE RESISTANCE

CROSS-REFERENCE TO RELATED APPLICATIONS

This is a continuation application of U.S. application Ser. No. 16/559,151, filed Sep. 3, 2019, which is a continuation and claims benefit of U.S. application Ser. No. 15/908,147, filed Feb. 28, 2018, which claims benefit of U.S. Patent Application Ser. No. 62/472,085, filed Mar. 16, 2017, all of which are incorporated herein by reference.

BACKGROUND

Modern cellular base stations are separated into two units, a baseband unit and a remote radio head. The baseband unit, or baseband system, is located on the ground, often proximate to a tower. The baseband unit modulates and demodulates digital data. Thus, for example, the baseband unit includes with a modulator and demodulator.

The remote radio head coupled to, and mounted proximate to, one or more antennas on a tower. The remote radio head down converts and up converts the digital data to radio frequencies and amplifies received and transmitted radio frequency signals. This respectively enhances reception sensitivity and broadcast power of the cellular base stations. Thus, for example, the remote radio head includes an upconverter, a down converter, a low noise amplifier, and a power amplifier.

However, the use of a remote radio head requires that power be supplied to the remote radio head, on the tower, through a power cable. However, as disclosed in U.S. Pat. No. 9,448,576, because the length of the cable can be hundreds of feet and the current drawn by the remote radio head can be, e.g., about 20 Amperes at a voltage level of about fifty volts, the power loss due to the power cable can be significant. U.S. Pat. No. 9,448,576 is incorporated by reference herein as if set forth in its entirety.

Power loss attributable to the power cable is problematic if the cellular base station needs to operate on backup battery power in the event of a power blackout. The power dissipated by the power cable can be sufficiently large to undesirably reduce the operating time of the cellular base station when powered by a battery backup system. An equally undesirable alternative, due to increased cost, would be to compensate for the loss by increasing the number of batteries in the battery backup system.

To reduce the power loss, the voltage provided to the power cable can be increased to proportionally reduce the current that must be provided to power the remote radio head. The reduction in current reduces power dissipation by the square of the current reduction, or voltage increase.

However, the power consumption of the remote radio head varies during its normal operation. As a result, the current drawn and hence the voltage provided to the remote radio head vary over time. To maintain a constant voltage at the input of the remote radio head, the resistance of the power cable must be known. Although the resistance can be measured when the cellular base station is constructed, the resistance can change over time due to environmental effects. Thus, there is a need to periodically measure the resistance of the power cable.

U.S. Pat. No. 9,448,576 describes adding circuitry to a power supply to characterize the resistance of the power cable. However, this increases the cost of the cellular base station. Therefore, there is a need for a less costly means of determining the resistance of the power cable.

SUMMARY

In one embodiment, a method is provided. The method comprises: setting a first voltage level provided to a cable; operating a radio, coupled to the cable, with constant power consumption; measuring a first current level provided to the cable; setting a second voltage level provided to the cable; measuring a second current level provided to the cable; and determining a first resistance of the cable using the first and second voltage and current levels.

DETAILED DESCRIPTION

Figure 1:
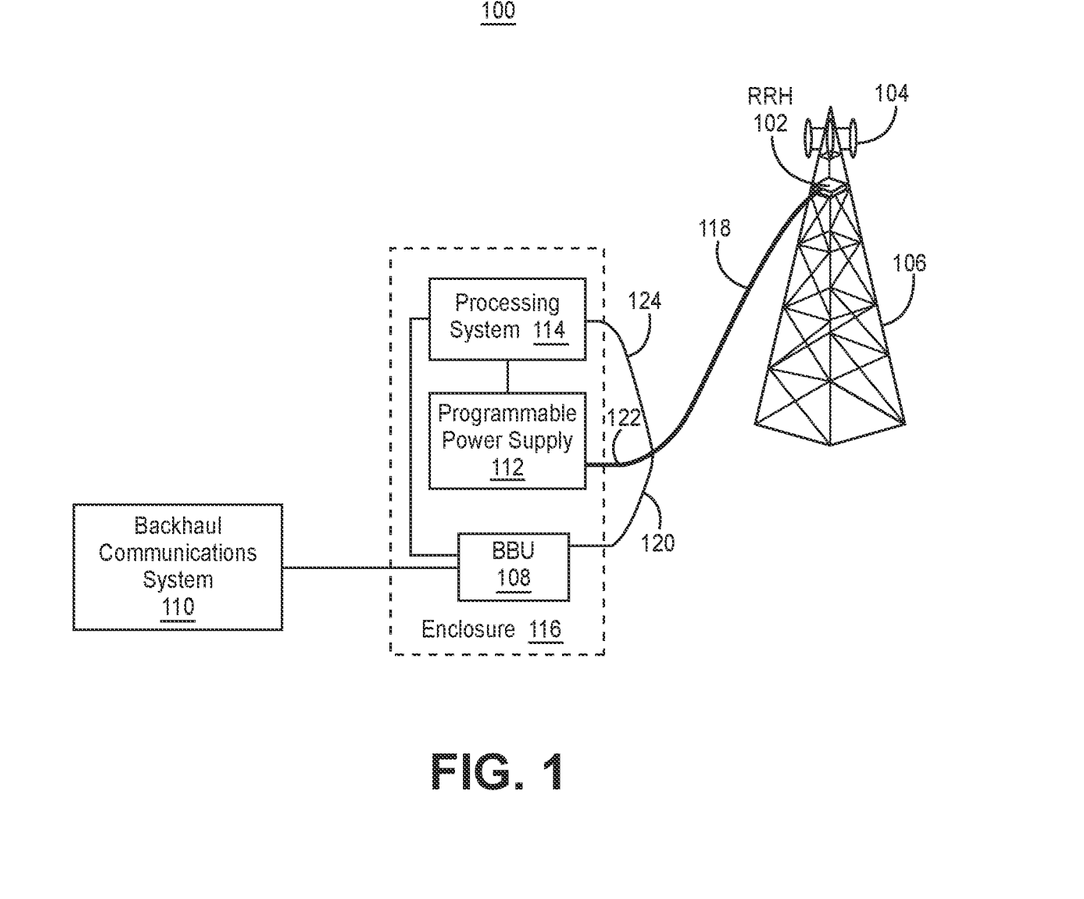
FIG. 1 illustrates one embodiment of a cellular base station.

FIG. 1 illustrates one embodiment of a cellular base station 100. The cellular base station 100 includes a remote radio head (RRH) 102 coupled to at least one antenna 104. The remote radio head 102 and the at least one antenna 104 are mounted on a tower 106. The remote radio head 102 is coupled to a baseband unit (BBU) 108. In another embodiment, the baseband unit 108 is not located on the tower, but in a building or enclosure, e.g. proximate to the base of the tower 106. In a further embodiment, the baseband unit 108 is coupled to a backhaul communications system 110. In yet another embodiment, the backhaul communications system 110 couples the cellular base station 100 to a core network of a cellular communications system. In yet a further embodiment, the remote radio head 102 is coupled, through a power cable 122, to a programmable power supply 112.

In one embodiment, a processing system 114 is coupled to the programmable power supply 112. In another embodiment, the processing system 114 is coupled to the remote radio head 102. In a further embodiment, the processing system 114 is coupled to the baseband unit 108

In one embodiment, the baseband unit 108 and the programmable power supply 112 are in an enclosure 116. In another embodiment, the enclosure 116 is proximate to the base of the tower 106. In a further embodiment, the processing system 114 is in the enclosure 116.

In one embodiment, although shown in FIG. 1 as being separate, the processing system is part of the programmable power supply 112 and/or the baseband unit 108. In another embodiment, the processing system 114 is located remotely from the programmable power supply 112 and the baseband unit 108. In a further embodiment, the processing system 114 is located at the operations center of (a) the cell systems operator, e.g. proximate to the core network, or (b) the manufacturer of the part or all of the base station. In yet another embodiment, the processing system 114 is located in a cloud based computing system.

In one embodiment, at least one cable 118 couples the baseband unit 108, programmable power supply 112, and/or processing system 114 to the remote radio head 102. In another embodiment, the at least one cable 118 includes a baseband cable 120 coupling the baseband unit 108 to the remote radio head 102. In a further embodiment, the baseband cable 120 is one or more fiber cables. In yet another embodiment, the at least one cable 118 includes a control data cable 124 coupling the processing system 114 and the remote radio head 102.

In one embodiment, the at least one cable 118 includes the power cable 122 that is used to provide power from the programmable power supply 112 to the remote radio head 102. In another embodiment, the programmable power supply 112 and the processing system 114 are used to determine, or estimate, the resistance of the power cable 122.

Figure 2:
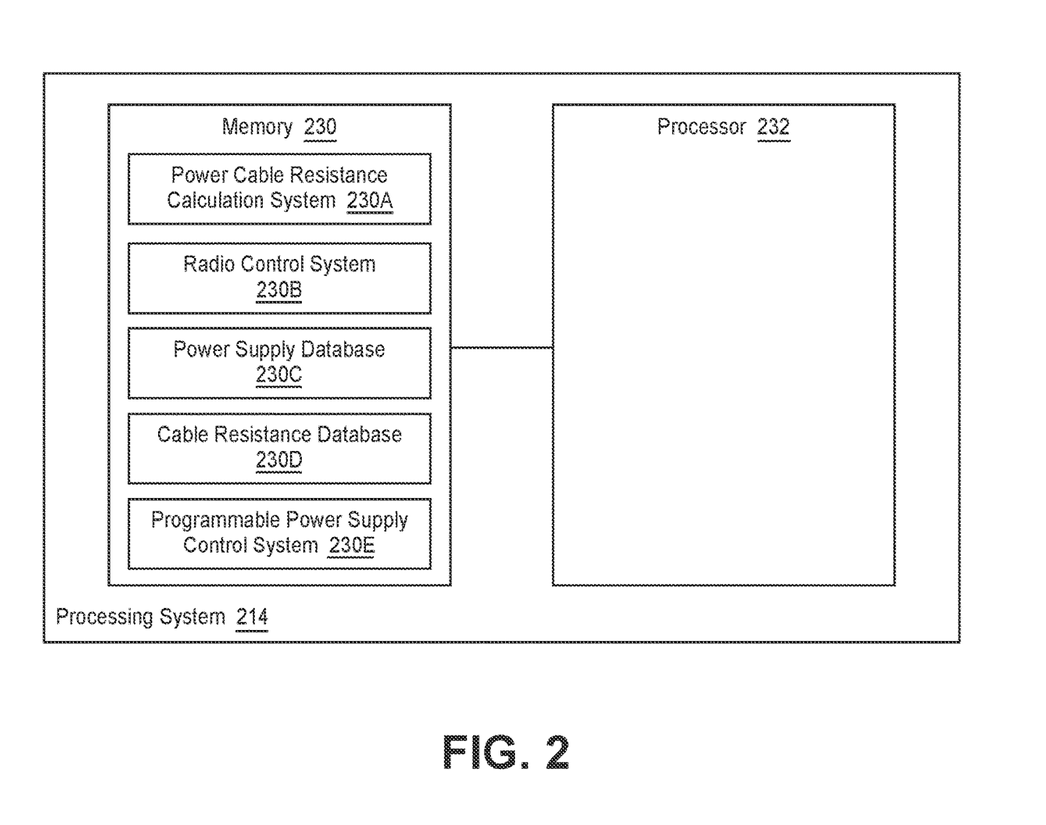
FIG. 2 illustrate one embodiment of the processing system.

FIG. 2 illustrate one embodiment of the processing system 214. The processing system 214 includes a memory 230 coupled to a processor 232. In one embodiment, the processing system 214 may be implemented, in whole or in part, by a state machine or a field programmable gate array.

In one embodiment, the memory 230 includes a power cable resistance calculation system 230A, power supply database 230C, cable resistance database 230D, and/or a programmable power supply control system 230E, which are processed by the processor 232. In another embodiment, the memory 230 includes a radio control system 230B. In a further embodiment, the power cable resistance calculation system 230 employs one or more of the cable resistance calculation methodologies described herein. In yet another embodiment, the radio control system 230B employs one or more of the techniques to maintain a substantially constant power consumption of the remote radio head 102. Database as used herein includes a conventional database, or any other techniques for storing data such as a data file.

In one embodiment, the calculations of power cable resistance, e.g. using Equation 11, described herein are implemented in the power cable resistance calculation system 230A. In another embodiment, the statistical analysis, e.g. calculation of averages or means, and standard deviations is implemented in the power cable resistance calculation system 230A.

In one embodiment, the power supply database 230C stores potential voltage settings with which to program the programmable power supply 112 to calculate resistance of the power cable 122 as further described herein. In another embodiment, the power supply database 230C stores the maximum and minimum operating voltages of the remote radio head 102. In a further embodiment, the power supply database 230C stores at least one voltage step pattern by which to vary the output voltage of the programmable power supply. In yet another embodiment, the at least one step time, i.e. the time for which a voltage step lasts. In yet a further embodiment, the power supply database 230C stores one or more sets of voltages and currents used to determine the resistance of the power cable 112. In one embodiment, the power supply database 230C stores the minimum current level required by the remote radio head 102 for normal operation.

In one embodiment, the cable resistance database 230D stores at least one calculated resistance of the power cable 122. In another embodiment, the cable resistance database 230D stores statistics about the at least one calculated resistance of the power cable 122. In a further embodiment, the cable resistance database 230D stores at least one set of calculated resistances of the power cable. In yet another embodiment, the cable resistance database 230D stores averages of two or more sets of cable resistances. In yet a further embodiment, the cable resistance database 230D stores at least one standard deviation threshold corresponding to the standard deviation of two or more resistances of the power cable 112 and/or two or more averages of resistances of the power cable 112. In one embodiment, the cable resistance database 230D stores M, the number of sets of calculated resistances which may be used in one of the resistance calculation embodiments.

In one embodiment, the programmable power supply control system 230E controls the output voltage of the programmable power supply 112, e.g. in response to data from the power supply data 230. In another embodiment, the programmable power supply control system 230E controls the length of time an output voltage is provided at the output of the programmable power supply 112, e.g. the step time.

Figure 3:
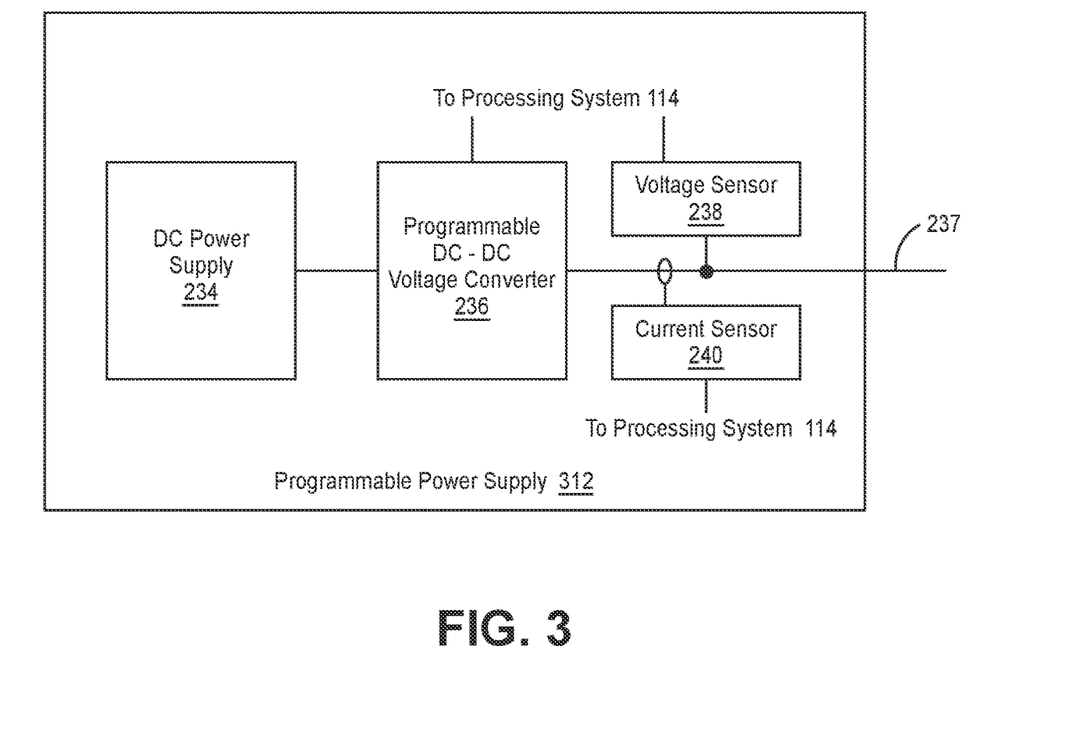
FIG. 3 illustrates one embodiment of the programmable power supply.

FIG. 3 illustrates one embodiment of the programmable power supply 312. The programmable power supply 112 includes a DC power supply 234 coupled to an input of a programmable DC-DC voltage converter 236. In one embodiment, the DC power supply 234 is a 48V telecommunications power supply. In another embodiment, the programmable DC-DC voltage converter 236 is a boost converter or a buck-boost converter. In a further embodiment, the programmable DC-DC voltage converter 236 is coupled to the processing system 114.

In one embodiment, the output of the programmable DC-DC voltage converter 236 is coupled to the output 237 of the programmable power supply 312. In another embodiment, the output of the programmable DC-DC voltage converter 236 is coupled to a voltage sensor 238 and a current sensor 240. In a further embodiment, the voltage sensor 238 and the current sensor 240 are coupled to the processing system 114. As will now be further described, the programmable power supply 112 and the processing system 114 may be used to determine, or estimate, the resistance of the power cable 122.

In one embodiment, resistance of the power cable 122 can be determined, or estimated, by maintaining substantially constant power consumption by the remote radio head 102 by taking the cellular base station 100 out of normal operation, e.g. so that it is not useable by user equipment, and placing it in a maintenance mode.

Constant power operation of the remote radio head 102 can be achieved in a variety of ways. In one embodiment, the cellular base station 100 is placed in cell bar mode disabling uplink and downlink transmissions, while only permitting supervisory channel transmissions. In another embodiment, the power amplifier in the remote radio head 102 is disabled, e.g. by issuing a command through a common public radio interface (CPRI) of the remote radio head 102. In a further embodiment, the command placing the cellular base station 100 in cell bar mode and/or disabling the power amplifier can be issued from the processing system 114, e.g. over the control data cable 124.

Further, in one embodiment, a constant envelope and frequency test tone can be broadcast by the remote radio head 102 to maintain substantially constant power consumption by the remote radio head 102. In another embodiment, the constant envelope and frequency tone can be directly injected, as a downlink IQ signal, into the remote radio head 102 through the common public radio interface, e.g. from the processing system 114 over the control data cable 124. In a further embodiment, the constant envelope and frequency tone can be indirectly injected into the remote radio head 102 from the baseband unit 108, e.g. based upon control signals provided to the baseband unit 108 from the processing system 114.

If the power consumed by the remote radio head 102 is substantially constant, then in one embodiment, the resistance of the power cable 122 can be determined as follows. The power ($P_{SUPPLY}$) provided to the power cable 122 by the programmable power supply 112 to power the remote radio head 102 is:

$$P_{SUPPLY} = P_{RRH} + P_{CABLE} \quad \text{(Equation 1)}$$

where $P_{RRH}$ is the power consumed by the remote radio head 102, and $P_{CABLE}$ is the power dissipated in the power cable 122.

The power from the programmable power supply 112 is known because the output voltage ($V_{SUPPLY}$) and output current ($I_{SUPPLY}$) of the programmable power supply 112 are programmed in the programmable power supply 112 and/or measured. For example, the measurements are made by the programmable power supply 112, e.g. by the voltage sensor 238 and current sensor 240, or by voltage and current sensors coupled to the output of the programmable power supply 112. Thus, $P_{SUPPLY}$ is:

$$P_{SUPPLY} = (V_{SUPPLY})(I_{SUPPLY}) \quad \text{(Equation 2)}$$

The current flowing through the power cable 122 is equal to the current flowing from the output of the programmable power supply 112. Therefore:

$$I_{CABLE} = I_{SUPPLY} \quad \text{(Equation 3)}$$

The total power lost in the power cable is a function of the cable resistance which needs to be determined. The equation for power loss in the power cable power 122, substituting $I_{SUPPLY}$ for $I_{CABLE}$, is:

$$P_{CABLE} = (I_{SUPPLY}^2)(R_{CABLE}) \quad \text{(Equation 4)}$$

The final variable in Equation 1 above requires the determination of power being consumed by the remote radio head 102. Because the power consumption of the remote radio head 102 is substantially constant, the power consumption of the remote radio head 102 can be designated by a constant term, C:

$$P_{RRH} = C \quad \text{(Equation 5)}$$

It is not necessary to know the power level of C because it be substantially constant. Therefore, substituting terms recited above, Equation 1 becomes:

$$(V_{SUPPLY})(I_{SUPPLY}) = C + (I_{SUPPLY}^2)(R_{CABLE}) \quad \text{(Equation 6)}$$

While the remote radio head 102 consumes substantially constant power, the output voltage, and hence the output current, of the programmable power supply 112 can be varied to have two or more sets of output voltages and output currents. These two or more sets of output voltages and output currents can be used to determine resistance of the power cable 122 without having to know the power consumption of the remote radio head 102. In one embodiment, when determining resistance of the power cable 122, the programmable power supply 112 provides two different output voltages, $V_1$ and $V_2$, and two corresponding, different output currents, $I_1$ and $I_2$. For each set of output voltage and corresponding output current, the power equations are:

$$P_{T1} = C + (I_1^2)(R_{CABLE}) \text{ where } P_{T1} = (V_1)(I_1) \quad \text{(Equation 7)}$$

$$P_{T2} = C + (I_2^2)(R_{CABLE}) \text{ where } P_{T2} = (V_2)(I_2) \quad \text{(Equation 8)}$$

By subtracting these two equations, the constant representing the power consumption of the remote radio head 102 is cancelled, and thus need not be known:

$$P_{T2} - P_{T1} = (I_2^2)(R_{CABLE}) - (I_1^2)(R_{CABLE}) = (R_{CABLE})(I_2^2 - I_1^2) \quad \text{(Equation 9)}$$

Thus, the resistance of the power cable 122 can be determined by knowing only the two sets of output voltages and output currents:

$$R_{CABLE} = \frac{P_{T2} - P_{T1}}{(I_2^2 - I_1^2)} \quad \text{(Equation 10)}$$

Thus:

$$R_{CABLE} = \frac{(V_2)(I_2) - (V_1)(I_1)}{(I_2^2 - I_1^2)} \quad \text{(Equation 11)}$$

Hence, the resistance of the power cable 122 can be calculated using Equation 11 and at least two sets of output voltage and output current of the programmable power supply 112.

Figure 4A:
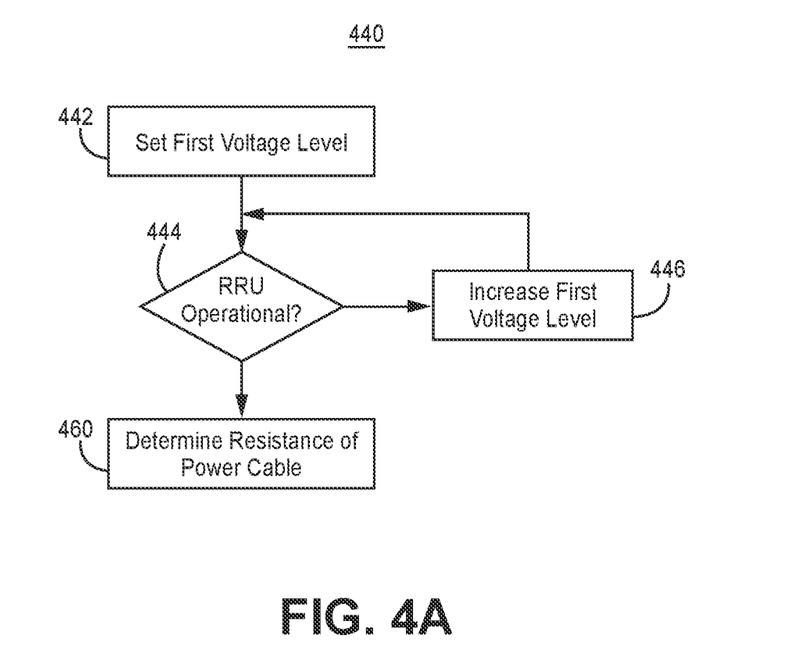
FIG. 4A illustrates one embodiment of a method of determining a resistance of a power cable.

FIG. 4A illustrates one embodiment of a method 440 of determining the resistance of a power cable 122. This method is applicable whether the power consumed by the remote radio head 102 remains constant or varies over time.

To the extent that the embodiment of method 440 shown in FIG. 4A is described herein as being implemented in the systems shown in FIGS. 1 through 3, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 442, set the output voltage, e.g. provided at the output of the programmable power supply 112, to a first voltage level. In one embodiment, the first voltage level is initially set to the maximum operating voltage of the remote radio head 102, e.g. that does not generate an alarm, for example 56 volts.

In one embodiment, in block 444, determine if the remote radio head 102 is operational, i.e. ready to operate as designed. In one embodiment, determine if the remote radio head 102 is operational by measuring the current drawn by the remote radio head 102, e.g. from the programmable power supply 112, and ascertain if it exceeds a threshold current level necessary for normal operation of the remote radio head 102. In another embodiment, monitor the common public radio interface to ascertain if the remote radio head 102 has established a link with the baseband unit 108 to determine if the remote radio head 102 has sufficient current for normal operation. If the remote radio head 102 is not operational, e.g. the current drawn is below the threshold level and/or no link has been established, then, in a further embodiment, in block 446, increase the output voltage, e.g. by a fixed amount such as one half of a volt. Then, return to block 444. If the remote radio head 102 is determined to be operational, then in block 460 determine the resistance of the power cable 122. The different embodiments for determining the resistance of the power cable 122 will be subsequently described.

Figure 4B:
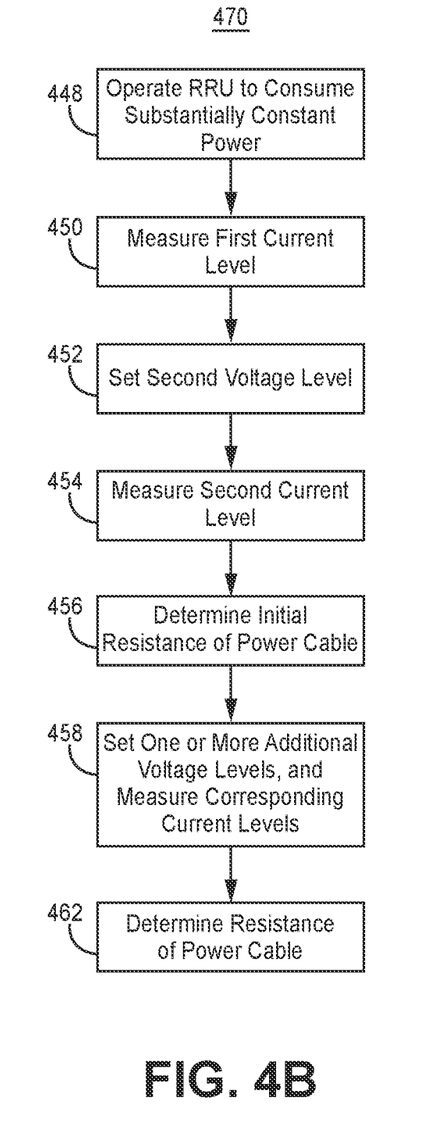
FIG. 4B illustrates one embodiment of a method of determining a resistance of a power cable when a remote radio head consumes substantially constant power.

FIG. 4B illustrates one embodiment of a method 470 of determining the resistance of a power cable 122 when the remote radio head 102 consumes substantially constant power. The method 470 implements block 460 of FIG. 4A when the remote radio head 102 consumes substantially constant power. To the extent that the embodiment of method 470 shown in FIG. 4B is described herein as being implemented in the systems shown in FIGS. 1 through 3, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 448, operate the remote radio head 102 so that the power consumption of the remote radio head 102 is substantially constant. This may be accomplished as exemplified above. In one embodiment, if this is done by having the remote radio head 102 broadcast a constant envelope and frequency test tone, e.g. provided by the baseband unit 108, this operation can be verified by checking for the presences of a tone in the downlink IQ data of the common public radio interface.

In block 450, measure a first current level, e.g. provided at the output of the programmable power supply 112. In one embodiment, also measure the first voltage level, e.g. at the output of the programmable power supply 112 and provided by the programmable power supply 112. In block 452, set a second voltage level, e.g. at the output of the programmable power supply 112. In another embodiment, the second voltage level is (a) decreased if the first voltage level is near the maximum operating voltage of the remote radio head 102, (b) increased if the first voltage level is near the minimum operating voltage of the remote radio head 102, or decreased or increased if the first voltage level is substantially between the minimum and maximum operating voltages of the remote radio head 102.

In block 454, measure a second current level, e.g. provide at the output of the programmable power supply 112. In one embodiment, also measure the second voltage level, e.g. provided at the output of the programmable power supply 112.

In block 456, determine the initial resistance of the power cable 122 with the first and second voltage and current levels, e.g. using the Equation 11. In one embodiment, the determined initial resistance of the power cable 122 can be used as the resistance of the power cable 122; no further analysis is required. However, in another embodiment, additional analysis is performed, for example, as is subsequently described.

In one embodiment, in block 458, set one or more additional voltage levels, at the output of the programmable power supply 112, and measure corresponding current levels, e.g. at the output of the programmable power supply 112. In another embodiment, calculate the voltage at the remote radio head 102, e.g., as follows: (a) calculate the voltage drop across the power cable 122 by multiplying the initial resistance of the power cable 122 by a measured current level at the output of the programmable power supply 112, and then (b) subtract the calculated voltage drop across the power cable 122 from the corresponding output voltage of the programmable power supply 112. If, based upon the calculation of the voltage at the remote radio head 102, the voltage level at the remote radio head 102 is determined to be near the maximum operating voltage of the remote radio head 102, then reduce the voltage level of the output of the power supply 112, e.g. in one or more fixed voltage steps, such as two-volt step(s). If the voltage level at the remote radio head 102 is near the minimum operating voltage of the remote radio head 102, then increase the voltage level of the output of the power supply 112, e.g. in one or more fixed voltage steps, such as two-volt step(s). If the voltage level at the remote radio head 102 is substantially in between the maximum and the minimum operating voltages of the remote radio head 102, then randomly increase and decrease the voltage level of the output of the power supply 112, e.g. in one or more voltage steps that are integer multiples of a fixed voltage step, such as a two-volt step; however, each stepped voltage level remains within the maximum and minimum operating voltage range of the remote radio head 102. In a further embodiment, also measure the voltage level for each step, e.g. at the output of the programmable power supply 112.

In one embodiment, in block 460, determine the resistance of the power cable 122. In another embodiment, determine, or calculate, resistance(s) of the power cable 122 based upon Equation 11 using unique pairs of the voltage levels and corresponding current levels, e.g. of the programmable power supply 112. The number of unique pairs, and hence the number of determined resistance(s) is:

$$\text{Number of Determined Resistances} = \text{Number of Measurements}/2 \qquad \text{(Equation 12)}$$

In one embodiment, the initial resistance of the power cable need not be recalculated.

Then, determine the resistance of the power cable 122 by averaging the calculated resistance(s). Alternatively, in a further embodiment, determine the resistance of the power cable 122 by performing a least mean square analysis on the output voltage and current levels using Equation 11.

In one embodiment, the resistance of the power cable 122 can be determined even if the power consumption of the remote radio head 102 varies during voltage and current measurements. This is achieved by varying voltage levels, e.g. at the output of the programmable power supply 112, and measuring output current, e.g. at the output of the programmable power supply 112, during relatively short time periods during which power consumption of the remote radio head 102 does not substantially change. In another embodiment, the duration of each period is constant from period to period, and is 100 milliseconds or less. In a further embodiment, voltage levels are measured, e.g. at the output of the programmable power supply 112, during each relatively short time period.

Figure 4C:
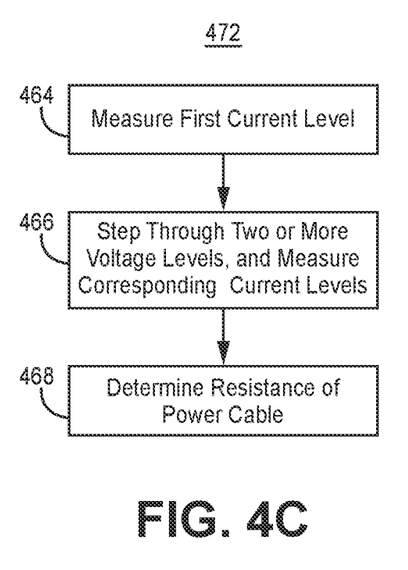
FIG. 4C illustrates one embodiment of a method of determining a resistance of a power cable when a remote radio head consumes time varying amounts of power.

FIG. 4C illustrates one embodiment of a method 470 of determining the resistance of a power cable 122 when the remote radio head 102 consumes time varying amounts of power. The method 472 implements block 460 of FIG. 4A when the remote radio head 102 consumes time varying amounts of power. To the extent that the embodiment of method 470 shown in FIG. 4C is described herein as being implemented in the systems shown in FIGS. 1 through 3, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 464, measure a first current level, e.g. provided at the output of the programmable power supply 112, during a relatively short time period during which the power consumption of the remote radio head 102 does not substantially change. In one embodiment, the relatively short time period is 100 millisecond or less. In another embodiment, also measure the first voltage level, e.g. provided at the output of the programmable power supply 112.

In block 466, step through two or more voltage levels, e.g. of the output of the programmable power supply 112, and measure corresponding current levels, e.g. provided at the output of the programmable power supply 112. If the voltage level, e.g. provided at the output of the programmable power supply 112, is near the maximum operating voltage of the remote radio head 102, then reduce the voltage level of the output of the power supply 112, e.g. in one or more fixed voltage steps, such as two-volt step(s). If the voltage level, e.g. at the output of the programmable power supply 112, is near the minimum operating voltage of the remote radio head 102, then increase the voltage level of the output of the power supply 112, e.g. in one or more fixed voltage steps, such as two-volt step(s). If the voltage level, e.g. at the output of the programmable power supply 112, is substantially in between the maximum and the minimum operating voltages of the remote radio head 102, then randomly increase and decrease the voltage level of the output of the power supply 112, e.g. in one or more voltage steps that are integer multiples of a fixed voltage step, such as a two-volt step; however, each stepped voltage level remains within the maximum and minimum operating voltage range of the remote radio head 102. In another embodiment, each voltage step lasts for a relatively short time period, e.g. 100 millisecond or less. In a further embodiment, also measure the voltage level for each step, e.g. at the output of the programmable power supply 112.

In one embodiment, in block 468, determine the resistance of the power cable 122. In one embodiment, determination of the resistance of the power cable 122 is performed by a least mean square analysis of the voltage and current levels using Equation 11.

Alternatively, in one embodiment, determine, or calculate or estimate, resistances of the power cable 122 based upon Equation 11 using unique pairs of the voltage levels and corresponding current levels. Then, create an ensemble of M sets of calculated resistances, where M is greater than 2 and, e.g., user defined or is predefined. In another embodiment, each set corresponds to a pair of resistance estimates calculated using Equation 11. In a further embodiment, each set corresponds to a pair of resistance estimates calculated using Equation 11 and pairs of voltage and corresponding measured current levels where both current levels were measured with a short time interval, e.g. 100 milliseconds or less, between each such measurement.

In one embodiment, for each computed set of resistance estimates, e.g. with the power cable resistance calculation system 230A, determine a mean power cable resistance and standard deviation for each set. In one embodiment, the resistance of the power cable 122 is the average power cable resistance of the set of power cable resistances having the lowest standard deviation.

Alternatively, in one embodiment, select the sets of power cable resistances that have a standard deviation equal to or below a user defined or predefined threshold, e.g. 0.1 ohms. Determine the average of the average cable resistance of each set having a standard deviation below the threshold; the average of the averages is the resistance of the power cable 122. In another embodiment, the foregoing analysis is implemented in the power cable resistance calculation system 230A.

Alternatively, in one embodiment, block 466 is performed by stepping through three or more of an odd integer of voltage levels and measuring the corresponding current levels. Thus, pairs of measured currents levels and corresponding voltages levels are obtained. In another embodiment, the voltage levels are also measured.

Each pair of voltage and corresponding measured current levels are obtained by measuring a second current level after a short time period, e.g. 100 milliseconds or less, after measuring the first current level. However, there is a randomly long period of time separating obtaining pairs of voltage and corresponding measured current levels. The second current level of an immediately preceding pair and first current level of an immediately succeeding pair are measured after a randomly long time period, e.g. a period of time uniformly distributed between 100 milliseconds and 1 second; in a further embodiment, generating random measurement time increments can be implemented in the programmable power supply control system 230E. Such random long time periods are used to increase the probability that a set of voltage and measured current levels are obtained when the remote radio head 102 consumes substantially constant power.

Then, in one embodiment, perform block 468 as follows. Determine, or calculate or estimate, resistances of the power cable 122 based upon Equation 11 using each pair of the voltage levels and corresponding current levels. Then, create an ensemble of M sets of calculated resistances, where M is greater than 2 and, e.g., user defined or is predefined. In another embodiment, each set corresponds to a pair of resistance estimates calculated using Equation 11 and pairs of voltage and corresponding measured current levels where both current levels were measured with a short time interval, e.g. 100 milliseconds or less, between each such measurement.

In another embodiment, for each computed set of resistance estimates, e.g. with the power cable resistance calculation system 230A, determine a mean power cable resistance and standard deviation for each set. In a further embodiment, the resistance of the power cable 122 is the average power cable resistance of the set of power cable resistances having the lowest standard deviation.

Alternatively, in one embodiment, perform block 468 as follows. Select the sets of power cable resistances that have a standard deviation equal to or below a user defined or predefined threshold, e.g. 0.1 ohms. Determine the average of the average cable resistance of each set having a standard deviation below the threshold; the average of the averages is the resistance of the power cable 122. In another embodiment, the foregoing analysis is implemented in the power cable resistance calculation system 230A.

EXAMPLE EMBODIMENTS

Example 1 includes a power supply, comprising: an output configured to be coupled by a power cable to a remote radio head; and wherein the power supply is configured to operate at at least two different sets of output voltages and currents which are used to determine the resistance of the cable.

Example 2 includes the power supply of Example 1, further comprising a current sensor coupled to the output of the power supply.

Example 3 includes the power supply of any of Examples 1-2, further comprising a voltage sensor coupled to the output of the power supply.

Example 4 includes the power supply of any of Examples 1-3, wherein the power supply further comprises: a DC power supply having a first supply output; a programmable DC-DC voltage converter coupled to the DC power supply and having a second supply output; and wherein the second supply output is coupled to the output.

Example 5 includes a system, comprising: a power supply having an output; wherein the output is configured to be coupled by a power cable to a remote radio head; a processing system coupled to the power supply; wherein the processing system comprises a memory coupled to a processor; wherein the memory comprises: a power cable resistance calculation system; a power supply database; a cable resistance database; and a power supply control system; and wherein the power supply is configured to operate at at least two different sets of operating voltages and currents which are used to determine the resistance of the cable.

Example 6 includes the power supply of Example 5, further comprising a current sensor coupled to the output of the power supply.

Example 7 includes the power supply of any of Examples 5-6, further comprising a voltage sensor coupled to the output of the power supply.

Example 8 includes the power supply of any of Examples 5-7, wherein the power supply further comprises: a DC power supply having a first supply output; a programmable DC-DC voltage converter coupled to the DC power supply and having a second supply output; and wherein the second supply output is coupled to the output.

Example 9 includes the power supply of any of Examples 5-8, wherein the memory further comprises a radio control system.

Example 10 includes a method, comprising: setting a first voltage level provided to a cable; operating a radio, coupled to the cable, with constant power consumption; measuring a first current level provided to the cable; setting a second voltage level provided to the cable; measuring a second current level provided to the cable; and determining a first resistance of the cable using the first and second voltage and current levels.

Example 11 includes the method of Example 10, further comprising: setting at least one additional voltage level provided to the cable; measuring corresponding current level for each of the at least one additional voltage level; determining a second resistance of the cable using the first and second voltage and current levels, and the at least one additional voltage level and corresponding at least one current level.

Example 12 includes the method of Example 11, wherein setting at least one additional voltage level comprises: decreasing the voltage levels provided to the cable if the first voltage level is proximate to the maximum operating voltage of the radio; increasing the voltage levels provided to the cable if the first voltage level is proximate to the minimum operating voltage of the radio; and randomly increasing and decreasing the voltage levels provided to the cable if the first voltage level is substantially in between the minimum and maximum operating voltages of the radio.

Example 13 includes the method of any of Examples 11-12, wherein determining the second resistance of the cable comprises: determining the least means squares of $$\frac{(V_2)(I_2) - (V_1)(I_1)}{(I_2^2 - I_1^2)}$$

using the first and second voltage and current levels, and the at least one additional voltage level and corresponding at least one current level.

Example 14 includes the method of any of Examples 11-13, wherein determining the) second resistance of the cable comprises: determining, with equation $$\frac{(V_2)(I_2) - (V_1)(I_1)}{(I_2^2 - I_1^2)},$$

at least one cable resistance using at least one unique set of voltage levels including one of the at least one additional voltage level, and corresponding one of the at least one current level; and averaging the first cable resistance and the at least one cable resistance.

Example 15 includes the method of any of Examples 10-14, further comprising measuring each voltage level.

Example 16 includes the method of any of Examples 10-15, further comprising: determining if the radio is operational; and if the radio is not operational, then increasing the first voltage level prior to measuring the first current level.

Example 17 includes a method, comprising: setting a first voltage level provided to a cable coupled to a radio; measuring a first current level provided to the cable during a short time period during which power consumption of the radio does not substantially change; stepping through two or more additional voltage levels provided to the cable, where each step has a corresponding short time period during which power consumption of the radio does not substantially change; measuring corresponding current levels for each additional voltage level; determining a resistance of the cable using the first voltage and current levels, and the two or more additional voltage levels and corresponding current levels.

Example 18 includes the method of Example 17, wherein stepping through two or more additional voltage levels comprises: decreasing, with each, step the voltage levels provided to the cable if the first voltage level is proximate to the maximum operating voltage of the radio; increasing, with each step, the voltage levels provided to the cable if the first voltage level is proximate to the minimum operating voltage of the radio; and randomly, with each step, increasing and decreasing the voltage levels provided to the cable if the first voltage level is substantially in between the minimum and maximum operating voltages of the radio.

Example 19 includes the method of any of Examples 17-18, wherein determining the resistance of the cable, comprises: determining the least means squares of $$\frac{(V_2)(I_2) - (V_1)(I_1)}{(I_2^2 - I_1^2)}$$

using the first voltage and current levels, and the two or more additional voltage levels and the corresponding current levels.

Example 20 includes the method of any of Examples 17-19, wherein determining the resistance of the cable, comprises: calculating cable resistances for each pair of measured currents and corresponding voltages with the equation $$\frac{(V_2)(I_2) - (V_1)(I_1)}{(I_2^2 - I_1^2)};$$

creating an ensemble of two or more sets of cable resistances; and determining a mean cable resistance and standard deviation for each set.

Example 21 includes the method of Example 20, wherein determining the resistance of the cable further comprises: selecting sets having a standard deviation equal to or below a threshold; and determining an average cable resistance of the average cable resistance of each selected set.

Example 22 includes the method of any of Examples 17-21, further comprising measuring each voltage level.

Example 23 includes the method of any of Examples 17-22, further comprising: determining if the radio is operational; and if the radio is not operational, then increasing the first voltage level prior to measuring the first current level.

Example 24 includes a method, comprising: setting a first voltage level provided to a cable coupled to a radio; measuring a first current level provided to the cable during a short time period during which power consumption of the radio does not substantially change; stepping through three or more integer number of additional voltage levels provided to the cable; measuring corresponding current levels for each additional voltage level, where current levels for pairs of voltage and current levels are measured within a short time period of one another, and where the second current level of each immediately preceding pair and the first current level of each immediately succeeding pair are measured after a randomly long time period; determining a resistance of the cable for each of the pairs of voltage and current levels.

Example 25 includes the method of Example 24, wherein stepping through three or more integer number of additional voltage levels comprises: decreasing, with each, step the voltage levels provided to the cable if the first voltage level is proximate to the maximum operating voltage of the radio; increasing, with each step, the voltage levels provided to the cable if the first voltage level is proximate to the minimum operating voltage of the radio; and randomly, with each step, increasing and decreasing the voltage levels provided to the cable if the first voltage level is substantially in between the minimum and maximum operating voltages of the radio.

Example 26 includes the method of any of Examples 24-25, wherein determining the resistance of the cable, comprises: calculating cable resistances for each pair of measured currents and corresponding voltages with the equation $$\frac{(V_2)(I_2) - (V_1)(I_1)}{(I_2^2 - I_1^2)};$$

creating an ensemble of two or more sets of cable resistances; and determining a mean cable resistance and standard deviation for each set.

Example 27 includes the method of Example 26, wherein determining the resistance of the cable further comprises determining an average cable resistance of the set having the lowest standard deviation.

Example 28 includes she method of any of Examples 24-27, further comprising measuring each voltage level.

Example 29 includes the method of any of Examples 24-28, further comprising: determining if the radio is operational; and if the radio is not operational, then increasing the first voltage level prior to measuring the first current level.

Example 30 includes an equipment enclosure, comprising: an enclosure; a power supply, in the enclosure, having an output; wherein the output is configured to be coupled by a power cable to a remote radio head; a processing system, in the enclosure, coupled to the power supply; wherein the processing system comprises a memory coupled to a processor; wherein the memory comprises: a power cable resistance calculation system; a power supply database; a cable resistance database; and a power supply control system; and wherein the power supply is configured to operate at at least two different sets of operating voltages and currents which are used to determine the resistance of the cable.

Example 31 includes the equipment enclosure of Example 30, further comprising a current sensor coupled to the output of the power supply.

Example 32 includes the equipment enclosure of any of Examples 30-31, further comprising a voltage sensor coupled to the output of the power supply.

Example 33 includes the equipment enclosure of any of Examples 30-32, wherein the power supply further comprises: a DC power supply having a first supply output; a programmable DC-DC voltage converter coupled to the DC power supply and having a second supply output; and wherein the second supply output is coupled to the output.

Example 34 includes the equipment enclosure of any of Examples 30-33, wherein the memory further comprises a radio control system.

Example 35 includes an equipment enclosure, comprising: an enclosure; a power supply, in the enclosure, having an output; wherein the output is configured to be coupled by a power cable to a remote radio head; wherein the power supply is configured to operate at at least two different sets of operating voltages and currents which are used to determine the resistance of the cable.

Example 36 includes the equipment enclosure of Example 35, further comprising a current sensor coupled to the output of the power supply.

Example 37 includes the equipment enclosure of any of Examples 35-36, further comprising a voltage sensor coupled to the output of the power supply.

Example 38 includes the equipment enclosure of any of Examples 35-37, wherein the power supply further comprises: a DC power supply having a first supply output; a programmable DC-DC voltage converter coupled to the DC power supply and having a second supply output; and wherein the second supply output is coupled to the output.

Example 39 includes the equipment enclosure of any of Examples 35-38, further comprising a baseband unit.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

The invention claimed is:
1. A system, comprising:
a direct current (DC) power supply comprising an output configured to be coupled by a power cable to a radio; and processing circuitry coupled to the DC power supply and configured to:
set a first voltage level provided at the output;
cause the radio to operate with constant power consumption;
receive a first current level provided at the output;
set a second voltage level provided to the output;
receive a second current level provided to the output; and
determine a first resistance of the power cable using the first voltage level, the second voltage level, the first current level, and the second current level.

2. The system of claim 1, wherein the processing circuitry is further configured to:
set at least one additional voltage level provided to the power cable;
receive a corresponding current level for each of the at least one additional voltage level; and
determine a second resistance of the power cable using the first voltage level, the second voltage level, the first current level, the second current level, the at least one additional voltage level, and a corresponding at least one current level.

3. The system of claim 2, wherein setting the at least one additional voltage level comprises:
decrease the at least one additional voltage level if the first voltage level is within a first threshold voltage level of a maximum operating voltage of the radio;
increase the at least one additional voltage level if the first voltage level is within a second threshold voltage level of a minimum operating voltage of the radio; and
randomly at least one of increase and decrease the at least one additional voltage level if the first voltage level is between the minimum operating voltage and the maximum operating voltage of the radio.

4. The system of claim 2, wherein determining the second resistance of the power cable comprises:
determine a least means squares of $$\frac{(V_2)(I_2) - (V_1)(I_1)}{(I_2^2 - I_1^2)},$$

using the first voltage level, the second voltage level, the first current level, and the second current level, and the at least one additional voltage level and the corresponding at least one current level.

5. The system of claim 2, wherein determining the second resistance of the power cable comprises:
determine, with equation $$\frac{(V_2)(I_2) - (V_1)(I_1)}{(I_2^2 - I_1^2)},$$

at least one other resistance of the power cable using at least one unique set of voltage levels including one of the at least one additional voltage level, and a corresponding one of the corresponding at least one current level; and
average the first resistance of the power cable and the at least one other resistance of the power cable.

6. The system of claim 1, wherein the processing circuitry is further configured to:
determine if the radio is operational; and
determine that the radio is not operational, then increase the first voltage level prior to receiving the first current level.

7. A program product comprising a non-transitory processor readable medium on which program instructions are embodied, wherein the program instructions are configured, when executed by at least one programmable processor, to cause the at least one programmable processor to:
set a first voltage level provided at an output, of a direct current power supply, configured to be coupled by a power cable to a radio;
cause the radio to operate with constant power consumption;
receive a first current level provided at the output;
set a second voltage level provided to the output;
receive a second current level provided to the output; and
determine a first resistance of the power cable using the first voltage level, the second voltage level, the first current level, and the second current level.

8. The program product of claim 7, wherein the program instructions are configured, when executed by the at least one programmable processor, to further cause the at least one programmable processor to:
set at least one additional voltage level provided to the power cable;
receive a corresponding current level for each of the at least one additional voltage level; and
determine a second resistance of the power cable using the first voltage level, the second voltage level, the first current level, the second current level, the at least one additional voltage level, and a corresponding at least one current level.

9. The program product of claim 8, wherein setting the at least one additional voltage level comprises:
decrease the at least one additional voltage level if the first voltage level is within a first threshold voltage level of a maximum operating voltage of the radio;
increase the at least one additional voltage level if the first voltage level is within a second threshold voltage level of a minimum operating voltage of the radio; and
randomly at least one of increase and decrease the at least one additional voltage level if the first voltage level is between the minimum operating voltage and the maximum operating voltage of the radio.

10. The program product of claim 8, wherein determining the second resistance of the power cable comprises:
determine a least means squares of $$\frac{(V_2)(I_2) - (V_1)(I_1)}{(I_2^2 - I_1^2)},$$

using the first voltage level, the second voltage level, the first current level, and the second current level, and the at least one additional voltage level and the corresponding at least one current level.

11. The program product of claim 8, wherein determining the second resistance of the power cable comprises:
determine, with equation $$\frac{(V_2)(I_2) - (V_1)(I_1)}{(I_2^2 - I_1^2)},$$

at least one other resistance of the power cable using at least one unique set of voltage levels including one of the at least one additional voltage level, and a corresponding one of the corresponding at least one current level; and average the first resistance of the power cable and the at least one other resistance of the power cable.

12. The program product of claim 7, wherein the program instructions are configured, when executed by the at least one programmable processor, to further cause the at least one programmable processor to:

determine if the radio is operational; and determine that the radio is not operational, then increase the first voltage level prior to receiving the first current level.

13. A method, comprising:

setting a first voltage level provided at an output, of a direct current power supply, configured to be coupled by a power cable to a radio;

causing the radio to operate with constant power consumption;

receiving a first current level provided at the output;

setting a second voltage level provided to the output;

receiving a second current level provided to the output; and determine a first resistance of the power cable using the first voltage level, the second voltage level, the first current level, and the second current level.

14. The method of claim 13, further comprising:

setting at least one additional voltage level provided to the power cable;

receiving a corresponding current level for each of the at least one additional voltage level; and determining a second resistance of the power cable using the first voltage level, the second voltage level, the first current level, the second current level, the at least one additional voltage level, and a corresponding at least one current level.

15. The method of claim 14, wherein setting the at least one additional voltage level comprises:

decreasing the at least one additional voltage level if the first voltage level is within a first threshold voltage level of a maximum operating voltage of the radio;

increasing the at least one additional voltage level if the first voltage level is within a second threshold voltage level of a minimum operating voltage of the radio; and randomly at least one of increasing and decreasing the at least one additional voltage level if the first voltage level is between the minimum operating voltage and the maximum operating voltage of the radio.

16. The method of claim 14, wherein determining the second resistance of the power cable comprises:

determining a least means squares of $$\frac{(V_2)(I_2) - (V_1)(I_1)}{(I_2^2 - I_1^2)},$$

using the first voltage level, the second voltage level, the first current level, and the second current level, and the at least one additional voltage level and the corresponding at least one current level.

17. The method of claim 14, wherein determining the second resistance of the power cable comprises:

determining, with equation $$\frac{(V_2)(I_2) - (V_1)(I_1)}{(I_2^2 - I_1^2)},$$

at least one other resistance of the power cable using at least one unique set of voltage levels including one of the at least one additional voltage level, and a corresponding one of the corresponding at least one current level; and averaging the first resistance of the power cable and the at least one other resistance of the power cable.

18. The method of claim 13, further comprising:

determining if the radio is operational; and determining that the radio is not operational, then increasing the first voltage level prior to receiving the first current level.

* * * * *